(12) United States Patent
Yamaguchi et al.

(10) Patent No.: US 11,901,233 B2
(45) Date of Patent: Feb. 13, 2024

(54) METHOD OF MANUFACTURING SEMICONDUCTOR ELEMENT AND SEMICONDUCTOR ELEMENT

(71) Applicant: NICHIA CORPORATION, Anan (JP)

(72) Inventors: Kazuki Yamaguchi, Tokushima (JP); Yoshitaka Sumitomo, Tokushima (JP)

(73) Assignee: NICHIA CORPORATION, Anan (JP)

( * ) Notice: Subject to any disclaimer, the term of this patent is extended or adjusted under 35 U.S.C. 154(b) by 153 days.

(21) Appl. No.: 17/327,005

(22) Filed: May 21, 2021

(65) Prior Publication Data
US 2021/0366772 A1 Nov. 25, 2021

(30) Foreign Application Priority Data

May 22, 2020 (JP) .................. 2020-090108
Apr. 28, 2021 (JP) .................. 2021-075885

(51) Int. Cl.
| | |
|---|---|
| *H01L 21/78* | (2006.01) |
| *B23K 26/53* | (2014.01) |
| *B23K 26/40* | (2014.01) |
| *H01L 23/544* | (2006.01) |
| *B23K 101/40* | (2006.01) |

(52) U.S. Cl.
CPC .............. *H01L 21/78* (2013.01); *B23K 26/40* (2013.01); *B23K 26/53* (2015.10); *H01L 23/544* (2013.01); *B23K 2101/40* (2018.08)

(58) Field of Classification Search
CPC ........ H01L 21/78; H01L 23/544; B23K 26/53
See application file for complete search history.

(56) References Cited

U.S. PATENT DOCUMENTS

| | | |
|---|---|---|
| 2010/0009547 A1 | 1/2010 | Sakamoto |
| 2013/0029444 A1 | 1/2013 | Sato |
| 2014/0015113 A1 | 1/2014 | Kuno et al. |
| 2017/0098733 A1 | 4/2017 | Tamemoto et al. |
| 2018/0247871 A1 | 8/2018 | Inoue et al. |
| 2021/0057222 A1 | 2/2021 | Sakamoto et al. |

FOREIGN PATENT DOCUMENTS

| | | |
|---|---|---|
| JP | 2008-016486 A | 1/2008 |
| JP | 2012-146874 A | 8/2012 |
| JP | 2013-048207 A | 3/2013 |
| JP | 2013-157452 A | 8/2013 |
| JP | 2015-130470 A | 7/2015 |
| JP | 2017-069510 A | 4/2017 |
| JP | 2018-142702 A | 9/2018 |

*Primary Examiner* — Mohammad M Choudhry
(74) *Attorney, Agent, or Firm* — Foley & Lardner LLP

(57) ABSTRACT

A method of manufacturing a semiconductor element includes a first irradiation step in which a laser beam is irradiated to form, in the interior of the substrate, a plurality of first modified portions aligned along a first direction; a second irradiation step in which a laser beam is irradiated to form a plurality of second modified portions aligned along the first direction at a position adjacent to the plurality of first modified portions in the second direction; and a third irradiation step which a laser beam is irradiated to form a plurality of third modified portions aligned along the first direction at a position closer to the first surface than the first modified portions and overlapping the plurality of first modified portions in a thickness direction of the substrate.

10 Claims, 12 Drawing Sheets

METHOD OF MANUFACTURING SEMICONDUCTOR ELEMENT AND SEMICONDUCTOR ELEMENT

CROSS-REFERENCE TO RELATED APPLICATIONS

This application claims priority to Japanese Patent Application No. 2020-090108, filed on May 22, 2020, and Japanese Patent Application No. 2021-075885, filed on Apr. 28, 2021, the disclosures of which are hereby incorporated by reference in their entireties.

BACKGROUND

The present disclosure relates to a method of manufacturing a semiconductor element and a semiconductor element.

In general, a semiconductor element is obtained by cutting a wafer in which semiconductor layers are formed on a substrate. As a method of cutting a wafer, a method is known in which a laser beam is focused in the interior of a substrate to form a modified region, and a crack extending from the modified region serves as a starting point to divide the wafer. For example, Japanese Patent Publication No. 2013-48207 discloses a laser cutting method in which two rows of modified regions arranged in parallel in a cutting street are formed by laser beam irradiation along a first straight line and a second straight line.

SUMMARY

In the method of Japanese Patent Publication No. 2013-48207, cracks are formed that reach a surface of the substrate from each of the two rows of modified regions. Thus, there arises a concern the substrate may be chipped when the substrate is cut.

An object of the present disclosure is to provide a method of manufacturing a semiconductor element and a semiconductor element in which a substrate is less likely to be chipped when the substrate is cut.

According to an aspect of the present disclosure, a method of manufacturing a semiconductor element includes performing a first irradiation in which, along a first direction parallel to a first surface of a substrate having the first surface and a second surface, a laser beam is irradiated from a first surface side to an interior of the substrate to form, a plurality of first modified portions aligned along the first direction in the interior of the substrate, and a crack extending from at least one of the plurality of first modified portions toward at least the first surface; performing a second irradiation in which, after performing the first irradiation, a laser beam is irradiated from a first surface side to a position shifted from the first modified portions in a second direction intersecting with the first direction and parallel to the first surface so as to form a plurality of second modified portions aligned along the first direction at a position adjacent to the plurality of first modified portions in the second direction; performing a third irradiation in which, after performing the second irradiation, a laser beam is irradiated from a first surface side along the first direction to form a plurality of third modified portions aligned along the first direction at a position closer to the first surface than the plurality of first modified portions and overlapping the plurality of first modified portions in a thickness direction of the substrate; and cutting the substrate in which, after performing the third irradiation, the substrate is pressed from a second surface side with a pressing member. No modified portion is formed at a position adjacent to the third modified portions in the second direction and overlapping the second modified portions in the thickness direction of the substrate.

According to a method of manufacturing a semiconductor element and a semiconductor element of the present disclosure, a substrate is less likely to be chipped when the substrate is cut.

BRIEF DESCRIPTION OF THE DRAWINGS

FIG. 11 is a schematic cross-sectional view of a semiconductor element manufactured according to an embodiment of the present disclosure.

DETAILED DESCRIPTION

Figure 1:
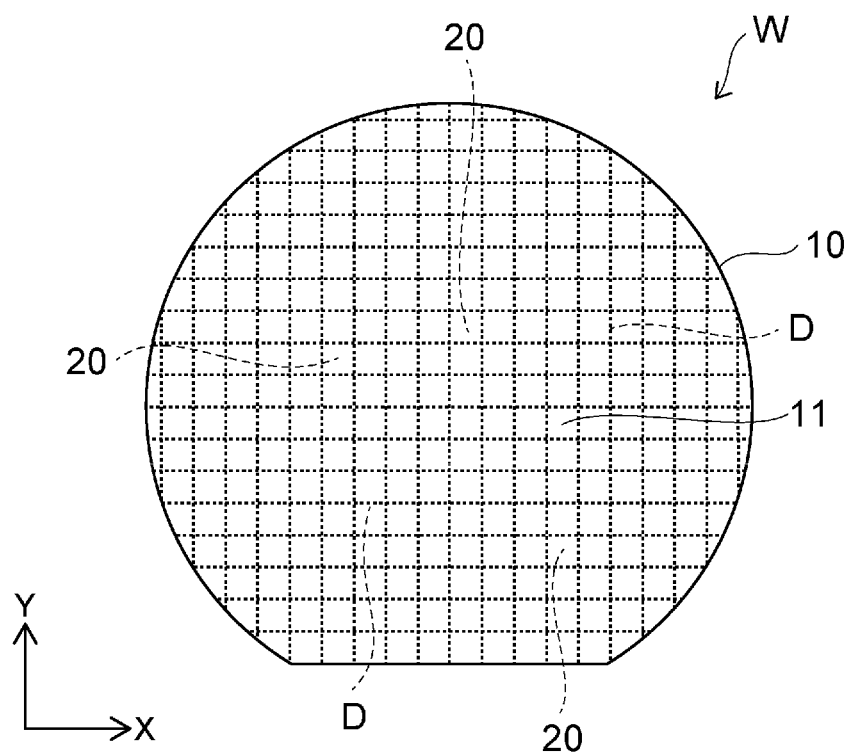
FIG. 1 is a schematic plan view of a wafer according to an embodiment of the present disclosure.

Embodiments will be described below with reference to the drawings. Note that, in the drawings, the same constituent elements are given the same reference characters.

A method of manufacturing a semiconductor element according to an embodiment of the present disclosure includes a step of providing a wafer, a step of irradiating a laser beam, and a step of cutting the wafer.

Figure 2:
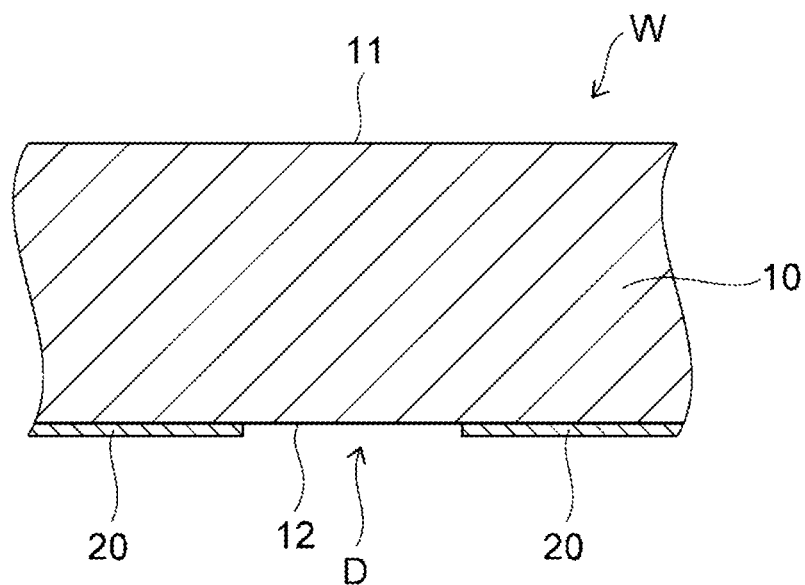
FIG. 2 is a schematic cross-sectional view of a wafer according to an embodiment of the present disclosure.

FIG. 1 is a schematic plan view of a wafer W according to an embodiment. FIG. 2 is a schematic cross-sectional view of a portion of the wafer W where a cutting street D is formed.

The wafer W includes a substrate 10 and a semiconductor layer 20. The substrate 10 has a first surface 11 and a second surface 12 on the opposite side to the first surface 11. The semiconductor layer 20 is provided on the second surface 12 of the substrate 10.

The substrate 10 is, for example, a sapphire substrate. The first surface 11 is, for example, the c-plane of the sapphire. The first surface 11 can be inclined relative to the c-plane in a range in which the semiconductor layer 20 can be formed with good crystallinity. In FIG. 1, the X direction and the Y direction represent two directions orthogonal to each other in a plane parallel to the first surface 11 of the substrate 10. For example, the X direction is set along the m-axis direction of the sapphire, and the Y direction is set along the a-axis direction of the sapphire.

The semiconductor layer 20 includes a nitride semiconductor represented by $In_xAl_yGa_{1-x-y}N$ ($0 \leq x$, $0 \leq y$, $x+y<1$). The semiconductor layer 20 includes an active layer. The active layer is, for example, an active layer that emits light. The peak wavelength of the light emitted by the active layer is, for example, in a range from 280 nm to 650 nm. The peak wavelength of the light emitted by the active layer can be a wavelength of 280 nm or less, or 650 nm or greater.

A plurality of the cutting streets D are formed in, for example, a lattice shape on the wafer W. The cutting streets D serve as boundary regions between a plurality of semiconductor elements to be singulated by cutting the wafer W, and are regions set with such a tolerance (width) that cutting the wafer W does not have an unfavorable influence on the semiconductor elements. Each cutting street D is also a scanning region of a laser beam for forming a modified portion (described later) in the substrate 10.

For example, the semiconductor layer 20 is not formed in the cutting streets D. The cutting streets D separate a plurality of the semiconductor layers 20 on the second surface 12 of the substrate 10. However, the semiconductor layers 20 can be formed over the entire second surface 12 of the substrate 10 without being separated by the cutting streets D.

The method of manufacturing the semiconductor element of the embodiment includes, after the step of providing the wafer W, the step of irradiating a laser beam.

The laser beam performs scanning along each of the plurality of cutting streets D while being irradiated from the first surface 11 side to the interior of the substrate 10. The laser beam performs scanning along a cutting street D extending in one of the X direction and the Y direction illustrated in FIG. 1, and thereafter the laser beam performs scanning along a cutting street D extending in the other direction.

The laser beam is emitted as pulses, for example. The pulse width of the laser beam can be in a range from 100 fsec to 1000 psec, for example. Examples of the laser beam source include an Nd:YAG laser, a titanium sapphire laser, an $Nd:YVO_4$ laser, and an Nd:YLF laser. The wavelength of the laser beam is a wavelength of light that passes through the substrate 10. The laser beam has a peak wavelength in a range from 500 nm to 1200 nm, for example.

The step of irradiating the laser beam includes a first irradiation step, a second irradiation step, and a third irradiation step.

First Embodiment

First Irradiation Step

Figure 3:
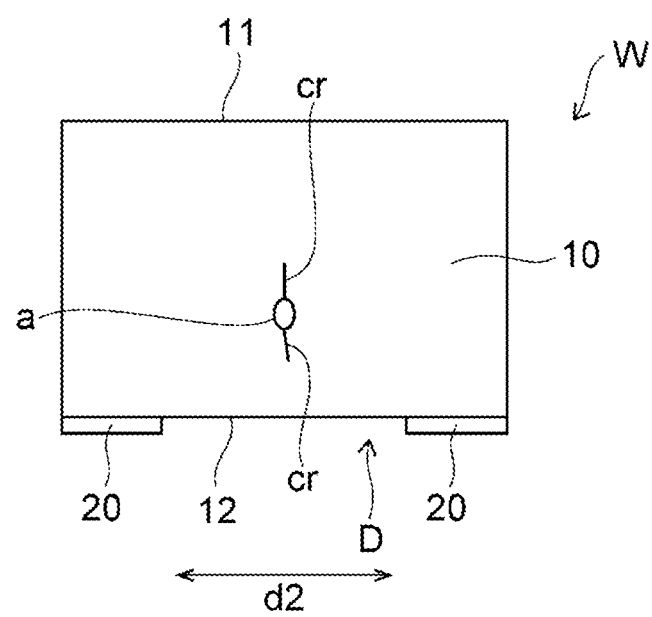
FIG. 3A is a schematic cross-sectional view illustrating a first irradiation step in a method of manufacturing a semiconductor element according to a first embodiment of the present disclosure.
FIG. 3B is a schematic plan view illustrating the first irradiation step in the method of manufacturing the semiconductor element according to the first embodiment of the present disclosure.
Figure 3:
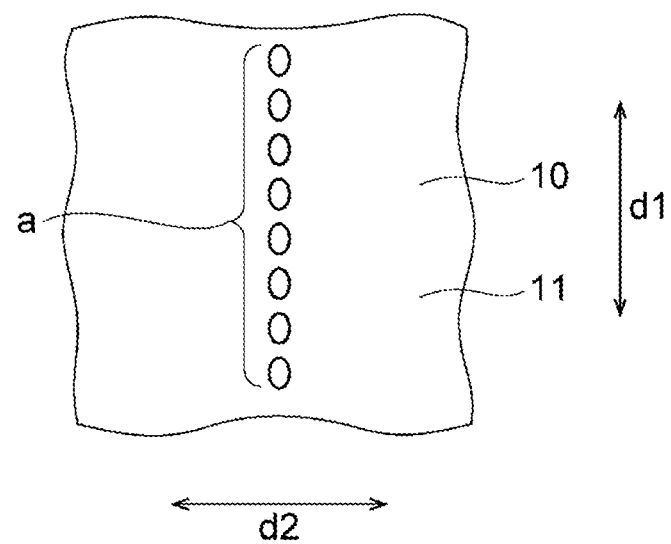

FIG. 3A is a schematic cross-sectional view illustrating a first irradiation step in a first embodiment.

FIG. 3B is a schematic plan view illustrating the first irradiation step in the first embodiment.

In FIGS. 3A and 3B, the scanning direction of the laser beam is referred to as a first direction d1. The first direction d1 is a direction parallel to the first surface 11 of the substrate 10. In the case in which scanning with the laser beam is performed along the X direction illustrated in FIG. 1, the first direction d1 is parallel to the X direction. In the case in which scanning with the laser beam is performed along the Y direction illustrated in FIG. 1, the first direction d1 is parallel to the Y direction. A direction intersecting with the first direction d1 is referred to as a second direction d2. For example, the second direction d2 is orthogonal to the first direction d1.

In the first irradiation step of the first embodiment, the interior of the substrate 10 is irradiated with a laser beam emitted from the first surface 11 side of the substrate 10 along the first direction d1. The laser beam is focused on a position at a predetermined depth inside the substrate 10, and the energy of the laser beam is concentrated on this position. A modified portion that is more brittle than a portion having undergone no laser beam irradiation is formed in this laser beam irradiation section (focusing section). The modified portion is, for example, a portion having a lower light transmissivity than a light transmissivity of a portion where laser irradiation has not been performed. A targeted position inside the substrate 10 that is targeted to be irradiated when a laser beam is irradiated thereto from the first surface 11 side may be shifted from a position where the modified portion is actually formed. In this case, the targeted position to be irradiated with the laser beam can be adjusted while taking the amount of shift into consideration. In the above-described first irradiation step, a first modified portion a is formed. Strain is generated in the first modified portion a, and when this strain is released, cracks cr are formed from the first modified portion a. A crack cr extending from the first modified portion a toward at least the first surface 11 is formed inside the substrate 10. The output of the laser beam (pulse energy) used for forming the first modified portion a is, for example, preferably in a range from 0.1 μJ to 20.0 μJ, is more preferably in a range from 1.0 μJ to 15.0 μJ, and is further more preferably in a range from 2.0 μJ to 10.0 μJ.

The scanning with the laser beam is performed discretely along the first direction d1 within the range of the cutting street D, so that a plurality of the first modified portions a are aligned along the first direction d1 are formed inside the substrate 10, as illustrated in FIG. 3B. The plurality of first modified portions a are, for example, formed discretely along the first direction d1. Alternatively, the plurality of first modified portions a can be formed in a continuous line extending in the first direction d1, in which portions of first modified portions a adjacent in the first direction d1 are in contact with each other (or overlap).

Second Irradiation Step

Figure 4:
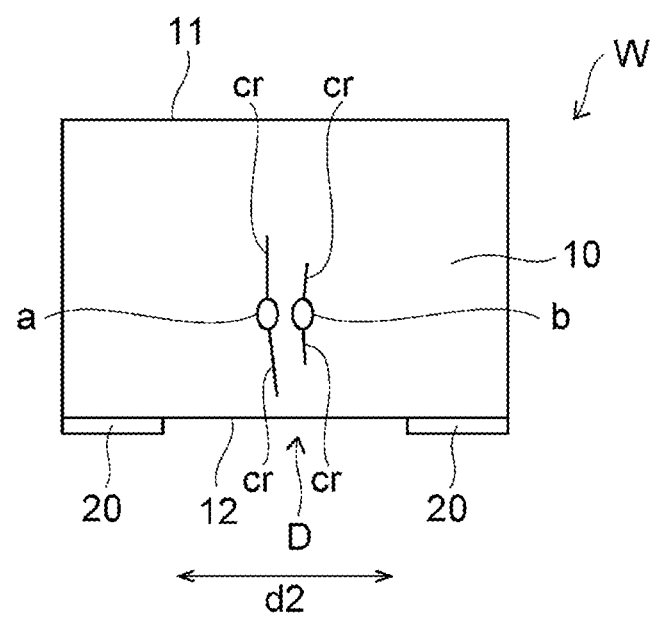
FIG. 4A is a schematic cross-sectional view illustrating a second irradiation step in the method of manufacturing the semiconductor element according to the first embodiment of the present disclosure.
FIG. 4B is a schematic plan view illustrating the second irradiation step in the method of manufacturing the semiconductor element according to the first embodiment of the present disclosure.
Figure 4:
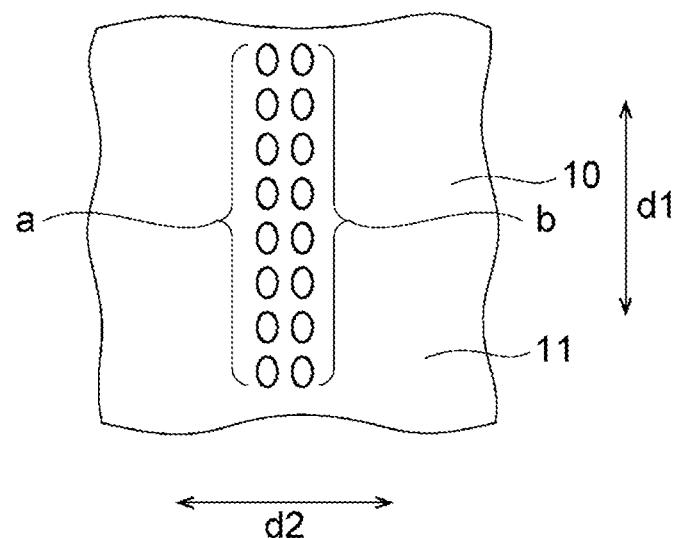

FIG. 4A is a schematic cross-sectional view illustrating a second irradiation step in the first embodiment.

FIG. 4B is a schematic plan view illustrating the second irradiation step in the first embodiment.

After the first irradiation step, the second irradiation step is performed. In the second irradiation step, a laser beam is irradiated from the first surface 11 side to a position shifted from the first modified portion a in the second direction d2. In the second irradiation step, a second modified portion b is formed inside the substrate 10.

The irradiation position of the laser beam in the thickness direction of the substrate 10 when forming the second modified portion b is substantially the same as the irradiation position of the laser beam in the thickness direction of the substrate 10 when forming the first modified portion a. Accordingly, the position of the second modified portion b in the thickness direction of the substrate 10 is substantially the same as the irradiation position of the first modified portion a in the thickness direction of the substrate 10. Herein, the expression "substantially the same" indicates that a shift of 10 µm or less is acceptable, and a shift of 5 µm or less is preferable. The first modified portion a and the second modified portion b are adjacent to each other in the second direction d2 within the range of the cutting street D. Herein, the expression "the first modified portion a and the second modified portion b are adjacent to each other in the second direction d2 within the range of the cutting street D" applies when at least a portion of the first modified portion a and at least a portion of the second modified portion b are adjacent to each other in the second direction d2. For example, the first modified portion a may be positioned apart from the second modified portion b in the second direction d2. Alternatively, a portion of the first modified portion a and a portion of the second modified portion b can be in contact with each other or overlap in the second direction d2. In the case in which a portion of the first modified portion a and a portion of the second modified portion b overlap, a strength of a portion where a portion of the first modified portion a and a portion of the second modified portion b overlap may be higher than a strength of a portion where a portion of the first modified portion a and a portion of the second modified portion b do not overlap, in a modified portion formed region. Accordingly, in the case in which the first modified portion a is positioned apart from the second modified portion b in the second direction d2, the force required to cut the wafer W can be reduced in a step of cutting the wafer W to be described later because the modified portions do not overlap or are not formed close to each other inside the substrate 10. When the first modified portion a is positioned apart from the second modified portion b in the second direction d2, the shortest distance between the first modified portion a and the second modified portion b is preferably in a range from 0.1 µm to 2 µm.

The scanning with the laser beam is performed discretely along the first direction d1 at a position shifted from the first modified portion a in the second direction d2. As illustrated in FIG. 4B, a plurality of second modified portions b aligned along the first direction d1 are formed at a position adjacent, in the second direction d2, to the plurality of first modified portions a aligned along the first direction d1.

In the case in which the plurality of first modified portions a are discretely formed along the first direction d1, the plurality of second modified portions b can also be formed discretely along the first direction d1 while being adjusted to the position of each of the first modified portions a in the first direction d1. Alternatively, in the case in which portions of the first modified portions a adjacent in the first direction d1 are in contact with each other (or overlap), and consequently the plurality of first modified portions a are formed in a continuous line extending in the first direction d1, the plurality of second modified portions b can also be formed in a continuous line extending in the first direction d1, in which portions of the second modified portions b adjacent in the first direction d1 are in contact with each other (or overlap). Either the plurality of first modified portions a or the plurality of second modified portions b can be formed in a continuous line shape extending in the first direction d1.

By forming the second modified portion b adjacent to the first modified portion a while being adjacent in the second direction d2, it is possible to promote the extension of the crack cr formed from the first modified portion a. When strain generated at the time of forming a modified portion is released, a crack is formed from the modified portion. It is assumed that, when a new modified portion is formed near a region where a modified portion has been formed and a crack has already been formed, force generated when the strain is released is considered to be applied not only to a crack that is newly formed from the new modified portion but also to the crack that is already formed. In other words, it is assumed that, because the force obtained when the strain generated at the time of forming the second modified portion b is released acts on the crack extending from the first modified portion a having already been formed, extension of the crack extending from the first modified portion a toward the first surface 11 of the substrate 10 is promoted. The output of the laser beam used for forming the second modified portion b is, for example, preferably in a range from 0.1 µJ to 20.0 µJ, is more preferably in a range from 1.0 µJ to 15.0 µJ, and is further more preferably in a range from 2.0 µJ to 10.0 µJ.

Third Irradiation Step

Figure 5:
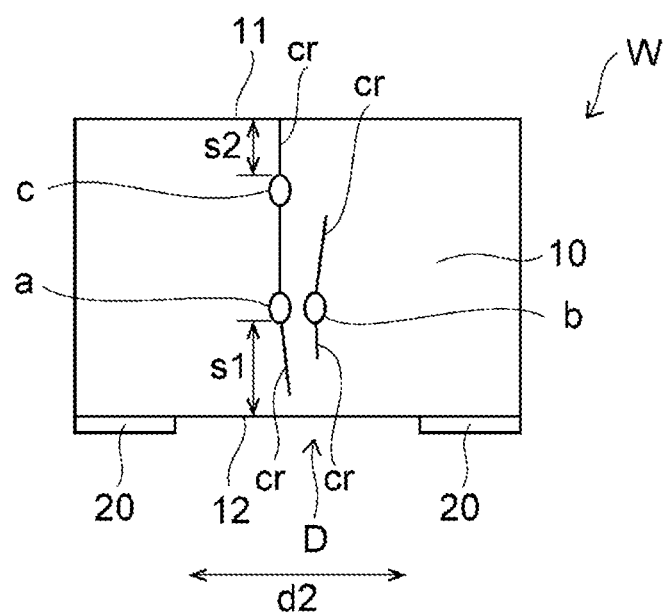
FIG. 5A is a schematic cross-sectional view illustrating a third irradiation step in the method of manufacturing the semiconductor element according to the first embodiment of the present disclosure.
FIG. 5B is a schematic plan view illustrating the third irradiation step in the method of manufacturing the semiconductor element according to the first embodiment of the present disclosure.
Figure 5:
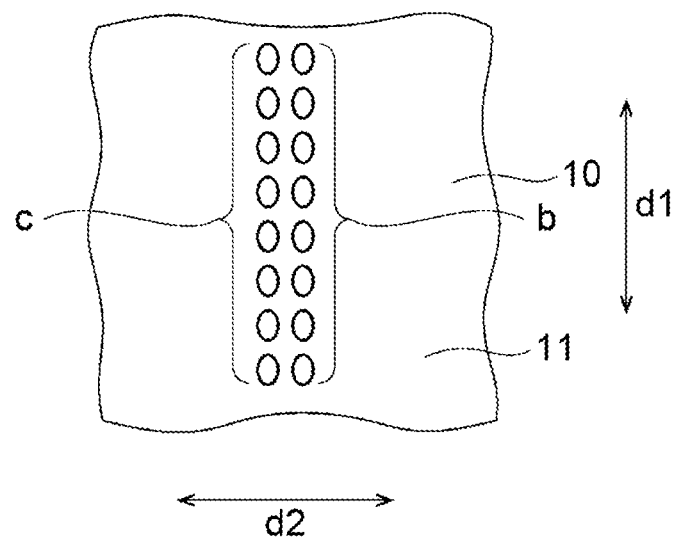

FIG. 5A is a schematic cross-sectional view illustrating a third irradiation step in the first embodiment.

FIG. 5B is a schematic plan view illustrating the third irradiation step in the first embodiment.

After the second irradiation step, the third irradiation step is performed. In the third irradiation step, a laser beam is irradiated along the first direction d1 from the first surface 11 side of the substrate 10. In the third irradiation step, a third modified portion c is formed inside the substrate 10. The irradiation position of the laser beam in the thickness direction of the substrate 10 when forming the third modified portion c is closer to the first surface 11 than the irradiation position of the laser beam in the thickness direction of the substrate 10 when forming the first modified portion a. Accordingly, the position of the third modified portion c in the thickness direction of the substrate 10 is closer to the first surface 11 than the position of the first modified portion a in the thickness direction of the substrate 10. The third modified portion c is formed at a position overlapping the first modified portion a in the thickness direction of the substrate 10. The first modified portion a is positioned apart from the third modified portion c in the thickness direction of the substrate 10.

In the third irradiation step, the scanning with the laser beam is performed discretely along the first direction d1, so that a plurality of the third modified portions c aligned along the first direction d1 are formed at a position closer to the first surface 11 side relative to the first modified portion a inside the substrate 10 and overlapping the plurality of first modified portions a in the thickness direction of the substrate 10.

In the case in which the plurality of first modified portions a are discretely formed along the first direction d1, the plurality of third modified portions c can also be formed discretely along the first direction d1. Alternatively, in the case in which portions of the first modified portions a adjacent in the first direction d1 are in contact with each other (or overlap), and consequently the plurality of first modified portions a are formed in a continuous line extending in the first direction d1, the plurality of third modified portions c can also be formed in a continuous line extending in the first direction d1, in which portions of the third modified portions c adjacent in the first direction d1 are in contact with each other (or overlap). Either the plurality of first modified portions a or the plurality of third modified portions c can be formed in a continuous line shape extending in the first direction d1.

Forming the third modified portion c causes a strain to be generated, and the crack cr is formed from the third modified portion c when this strain is released. The third modified portion c is set at a position overlapping the first modified portion a in the thickness direction of the substrate 10. As a result, in the case in which the crack cr is formed extending from the third modified portion c toward the second surface 12, this crack cr can join with the crack cr extending from the first modified portion a toward the first surface 11.

The crack cr extending from the third modified portion c toward the first surface 11 reaches the first surface 11. Alternatively, the crack cr extending from the third modified portion c toward the first surface 11 reaches a position near the first surface 11. In either case, the crack cr extending from the third modified portion c toward the first surface 11 reaches a position closer to the first surface 11 than the crack cr extending toward the first surface 11 from the second modified portion b positioned farther from the first surface 11 (a position closer to the second surface 12) than the third modified portion c. The crack cr extending from the second modified portion b does not or is less likely to reach the first surface 11.

The first irradiation step, the second irradiation step, and the third irradiation step described above are performed on each of the plurality of cutting streets D illustrated in FIG. 1.

Step of Cutting Wafer W

Figure 6:
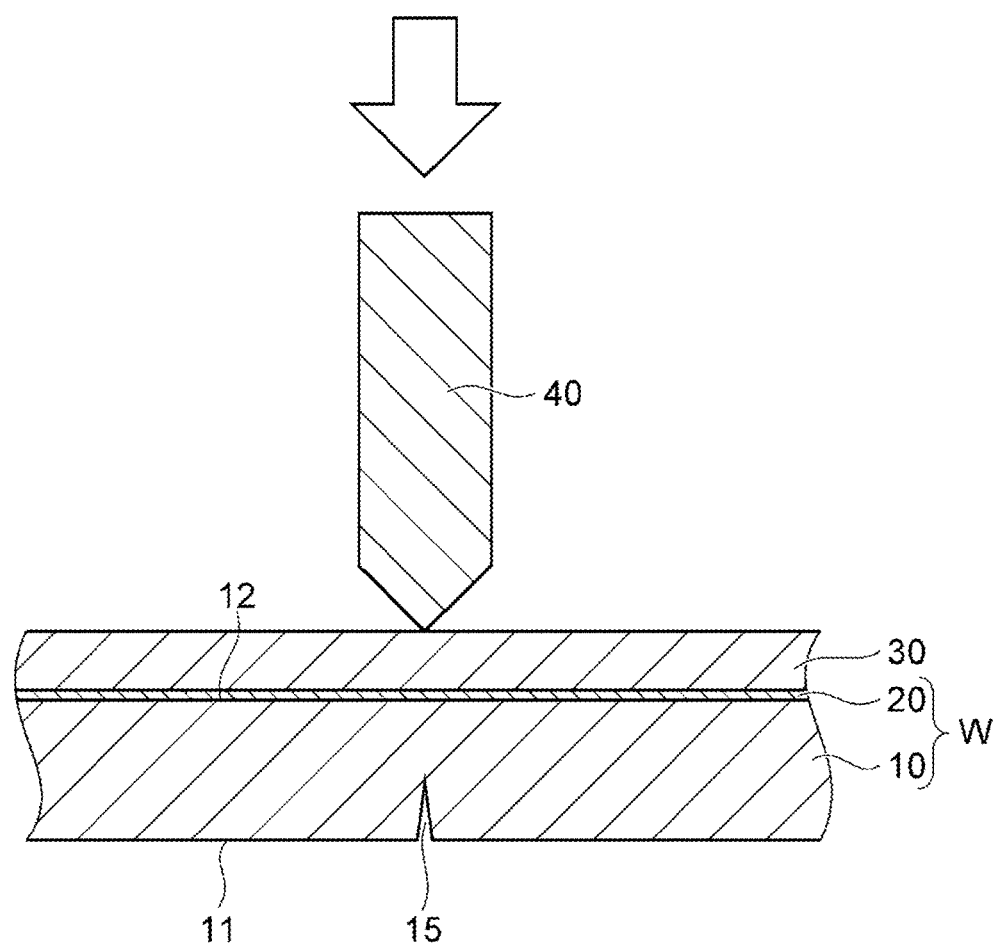
FIG. 6 is a schematic cross-sectional view illustrating a cutting step in the method of manufacturing the semiconductor element according to an embodiment of the present disclosure.

After the third irradiation step, a step of cutting the wafer W is performed. FIG. 6 is a schematic cross-sectional view illustrating the step of cutting the wafer W.

A surface of the wafer W on a side where the semiconductor layer 20 is formed is bonded to a sheet 30. Then, the substrate 10 is pressed with a pressing member 40 from the second surface 12 side via the sheet 30. The pressing member 40 is, for example, a blade-shaped member extending along the cutting street D. The substrate 10 is subject to a pressing force of the pressing member 40 from the second surface 12 side and begins to split starting from a crack that has extended from the third modified portion c and reached the first surface 11 or the vicinity of the first surface 11. That is, a groove 15 with a V-shaped cross section that opens to the first surface 11 is formed along the cutting street D, and the groove 15 reaches the second surface 12 to cut the wafer W. The wafer W can be cut by another method as long as the method is such that the wafer W begins to split starting from a crack that extends from the third modified portion c and reaches the first surface 11 or the vicinity of the first surface 11.

Figure 7:
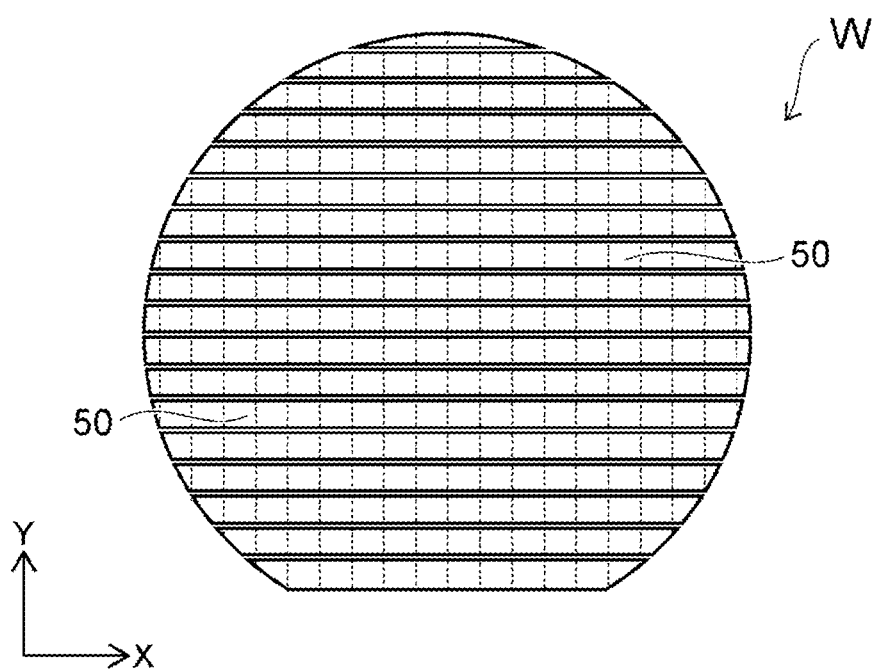
FIG. 7A is a schematic plan view illustrating the cutting step in the method of manufacturing the semiconductor element according to an embodiment of the present disclosure.
FIG. 7B is a schematic plan view illustrating the cutting step in the method of manufacturing the semiconductor element according to an embodiment of the present disclosure.
Figure 7:
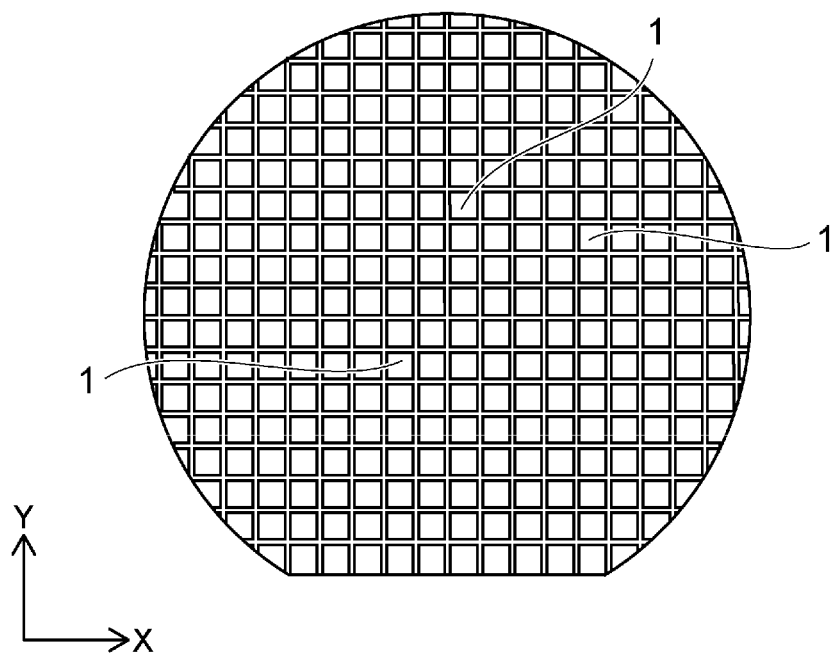

For example, the wafer W is cut along the cutting streets D extending along the X direction, so that the wafer W is separated into a plurality of bars 50 extending in the X direction, as illustrated in FIG. 7A.

Thereafter, the bars 50 are cut along the cutting streets D extending along the Y direction, so that the wafer W is singulated into a plurality of semiconductor elements 1, as illustrated in FIG. 7B. The cutting along the Y direction can be performed prior, and then the cutting along the X direction can be performed.

On a lateral surface of each of the singulated semiconductor elements 1, the above-described first and third modified portions a and c are exposed as a region having larger surface roughness than a surface roughness of a section where the modified portions are not formed.

According to the first embodiment described above, by forming the second modified portion b adjacent to the first modified portion a, it is possible to promote the extension of a crack generated from the first modified portion a toward the first surface 11. This makes it easy to cleave even in a case in which the substrate 10 is thick. The thickness of the substrate 10 is, for example, in a range from 100 μm to 1500 μm, is preferably in a range from 150 μm to 1200 μm, and is more preferably in a range from 300 μm to 1000 μm.

A distance between the center of the first modified portion a and the center of the second modified portion b in the second direction d2 within a range of one cutting street D is set within a range in which a force obtained when a strain generated at the time of forming the second modified portion b is released acts on a crack extending from the already-formed first modified portion a, thereby making it possible to promote the extension of the crack extending from the first modified portion a toward the first surface 11 of the substrate 10. For example, the distance between the center of the first modified portion a and the center of the second modified portion b in the second direction d2 is preferably in a range from 2 μm to 10 μm.

No modified portion is formed at a position adjacent to the third modified portion c in the second direction d2 and overlapping the second modified portion b in the thickness direction of the substrate 10. Within the range of one cutting street D, there is no modified portion adjacent to the third modified portion c in the second direction d2. No modified portion is formed at a position that is adjacent to the third modified portion c in the second direction d2 and overlaps a region between the first modified portion a and the second modified portion b in the thickness direction of the substrate 10.

As a result, a crack that reaches the first surface 11 or the vicinity of the first surface 11 is unlikely to be formed at a position adjacent to, in the second direction d2, a crack that extends from the third modified portion c and that reaches the first surface 11 or the vicinity of the first surface 11. The crack that extends from the second modified portion b does not reach a position closer to the first surface 11 than the crack that extends from the third modified portion c. When cracks that reach the first surface 11 or the vicinity of the first surface 11 are limited to those extending from the third modified portion c within the range of one cutting street D, it is possible to reduce the number of cracks that contribute to the beginning of splitting from the first surface 11 side. For example, cracks that contribute to the beginning of splitting from the first surface 11 side can be limited to one crack extending from the third modified portion c. With such a configuration, the substrate 10 is less likely to be chipped when the substrate 10 begins to split from the first surface 11 side while easily forming a crack extending toward the first surface 11.

After the third irradiation step, a fourth irradiation step can also be provided in which a laser beam is irradiated from the first surface 11 side under a condition that a modified portion can be formed. The fourth irradiation step is a step of irradiating the same position as that of the third modified portion c with a laser beam. There is a case in which a new modified portion is not formed by the fourth irradiation step in a region overlapping the third modified portion c. The fourth irradiation step can facilitate the extension of a crack extending from the third modified portion c toward the first surface 11, and the crack can easily reach the first surface 11. With the crack having reached the first surface 11, the substrate 10 becomes more likely to split from the first surface 11 side. In this case as well, because no modified portion is formed adjacent to the third modified portion c in the second direction d2, cracks that reach the first surface 11 within the range of one cutting street D can be limited to a crack extending from the third modified portion c, and therefore, the substrate 10 is less likely to be chipped. The condition that a modified portion can be formed is, for example, the same as a condition of the third irradiation step. By the fourth irradiation step, a part or whole of the third modified portion c may not be further modified on the same position as the third modified portion c, or a part or whole of the third modified portion c may be modified. Another modified portion may be formed in addition to the third modified portion c.

Because the semiconductor layer 20 is provided on the second surface 12 of the substrate 10, in order to suppress thermal damage to the semiconductor layer 20 due to the irradiation of the laser beam, the irradiation position of the laser beam in the first irradiation step is preferably positioned apart from the second surface 12 by a predetermined distance (a distance at which the semiconductor layer 20 is not subjected to thermal damage) or more.

In addition, because the split begins from the first surface 11 side when the pressing force is applied from the second surface 12 side with the pressing member 40, forming the third modified portion c closer to the first surface 11 can facilitate the crack extending from the third modified portion c to reach the first surface 11. Thus, cutting can be easily achieved.

Accordingly, as illustrated in FIG. 5A, it is preferable to form the first modified portion a and the third modified portion c in such a manner that a distance s1 from the first modified portion a to the second surface 12 is greater than a distance s2 from the third modified portion c to the first surface 11. In the case in which a thickness of the substrate 10 is in a range from 300 μm to 1000 μm, the length of the distance s1 is, for example, in a range from 100 μm to 300 μm, and the length of the distance s2 is, for example, in a range from 50 μm to 200 μm. Also in the case in which the thickness of the substrate 10 is less than 300 μm, the first modified portion a and the third modified portion c can be formed such that the distance s1 from the first modified portion a to the second surface 12 is greater than the distance s2 from the third modified portion c to the first surface 11.

Second Embodiment

Figure 8:
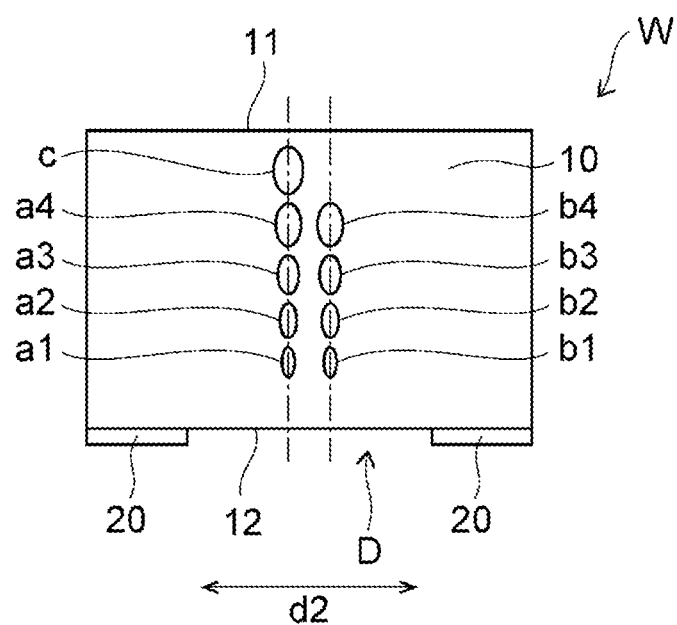
FIG. 8 is a schematic cross-sectional view illustrating a step of irradiating a laser beam in a method of manufacturing the semiconductor element according to a second embodiment of the present disclosure.

FIG. 8 is a schematic cross-sectional view illustrating a step of irradiating a laser beam in a method of manufacturing a semiconductor element according to a second embodiment of the present disclosure.

In the present embodiment, prior to a third irradiation step, a first irradiation step and a second irradiation step are repeated to form a plurality of pairs of a first modified portion and a second modified portion in the thickness direction of the substrate 10, each pair of the first modified portion and the second modified portion adjacent to each other in the second direction d2.

A first pair of a first modified portion a1 and a second modified portion b1 adjacent to each other in the second direction d2 is formed at a position closest to the second surface 12. A second pair of a first modified portion a2 and a second modified portion b2 adjacent to each other in the second direction d2 is formed at a position closer to the first surface 11 than the first pair. A third pair of a first modified portion a3 and a second modified portion b3 adjacent to each other in the second direction d2 is formed at a position closer to the first surface 11 than the second pair. A fourth pair of a first modified portion a4 and a second modified portion b4 adjacent to each other in the second direction d2 is formed at a position closer to the first surface 11 than the third pair. Each pair is aligned along the first direction d1, similar to the first modified portion a and the second modified portion b in the first embodiment.

A third modified portion c is formed at a position closer to the first surface 11 than the first modified portion a4 of the fourth pair. The third modified portion c and the first modified portions a1 to a4 overlap one another in the thickness direction of the substrate 10. The center of the third modified portion c and the centers of the first modified portions a1 to a4 are positioned on the same virtual line (represented by a dot-dash line in FIG. 8) in the thickness direction of the substrate 10.

The second modified portions b1 to b4 overlap one another in the thickness direction of the substrate 10. The centers of the second modified portions b1 to b4 are positioned on the same virtual line (represented by the dot-dash line in FIG. 8).

The first irradiation step and the second irradiation step for forming modified portions at the same depth are sequentially performed, and modified portions at deeper positions are formed earlier. That is, the first irradiation step and the second irradiation step are alternately repeated such that the first modified portion a1, the second modified portion b1, the first modified portion a2, the second modified portion b2, the first modified portion a3, the second modified portion b3, the first modified portion a4, and the second modified portion b4 are formed in that order. Thereafter, in the third irradiation step, the third modified portion c is formed.

In the second embodiment as well, no modified portion is formed at a position adjacent to the third modified portion c in the second direction d2 and overlapping the second modified portions b1 to b4 in the thickness direction of the substrate 10.

According to the second embodiment, by forming a plurality of pairs of the first modified portions a1 to a4 and the second modified portions b1 to b4 in the thickness direction of the substrate 10, the extension of a crack in the thickness direction of the substrate 10 can be facilitated even in a case in which the substrate 10 is thick. Thus, cutting can be easily achieved. Furthermore, because no modified portion is formed at a position adjacent to the third modified portion c in the second direction d2 and overlapping the second modified portions b1 to b4 in the thickness direction of the substrate 10, the substrate 10 is less likely to be chipped when the substrate 10 begins to split from the first surface 11 side.

In the case in which the output of a laser beam irradiating from the first surface 11 side to the interior of the substrate 10 is constant in the thickness direction of the substrate 10, the energy of the laser beam in the focusing section tends to reduce as being farther from the first surface 11 due to absorption or the like in the substrate 10. As a result, in the plurality of pairs of the first modified portions a1 to a4 and the second modified portions b1 to b4, the size of the paired modified portions tends to reduce as being farther from the first surface 11 (closer to the second surface 12). Accordingly, as illustrated in FIG. 8, as the pair is farther from the first surface 11, the separation distance in the second direction d2 between each of the first modified portions a1 to a4 and each of the second modified portions b1 to b4 increases. That is, as the pair is farther from the first surface 11, the second modified portions b1 to b4 tend to have a smaller influence on the promotion of extension of the cracks of the first modified portions a1 to a4 adjacent to the second modified portions b1 to b4. In the second embodiment, a shortest distance between a pair of the first modified portion and the second modified portion in the second direction d2 closest to one of the third modified portions c is preferably in a range from 0.1 μm to 2 μm. The shortest distance in the second direction d2 between a pair of the first modified portion and the second modified portion farthest from the first surface 11 is preferably in a range from 0.1 μm to 6 μm. In the case in which the distance in the second direction d2 between a pair of the first modified portion and the second modified portion farthest from the first surface 11 is set in this range, the second modified portions readily influence on the promotion of extension of the cracks of the first modified portions adjacent to this second modified portions.

Third Embodiment

Figure 9:
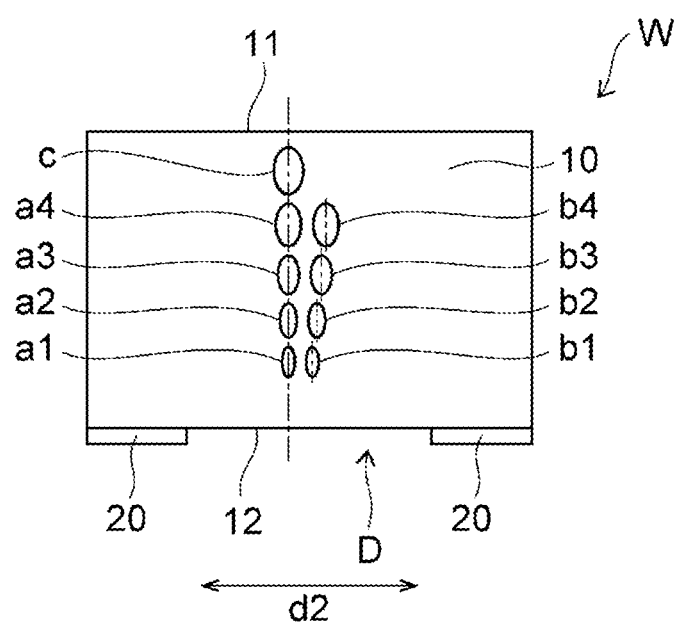
FIG. 9 is a schematic cross-sectional view illustrating a step of irradiating a laser beam in a method of manufacturing a semiconductor element according to a third embodiment of the present disclosure.

FIG. 9 is a schematic cross-sectional view illustrating a step of irradiating a laser beam in a method of manufacturing a semiconductor element according to a third embodiment of the present disclosure. In FIG. 9, a virtual line passing through the centers of modified portions in the second direction d2 and extending along the thickness direction of the substrate 10 is represented by a dot-dash line.

The third embodiment differs from the second embodiment illustrated in FIG. 8 in the following points. That is, in the third embodiment, in a plurality of pairs of the first modified portions a1 to a4 and the second modified portions b1 to b4, as the pair is closer to the second surface 12, a distance in the second direction d2 between the centers of each of the first modified portions a1 to a4 and each of the second modified portions b1 to b4 is smaller.

In the third embodiment, in a second irradiation step in which the second modified portions b1 to b4 are formed, a laser beam irradiation position (focusing position) is brought closer to the first modified portions a1 to a4 farther from the first surface 11, at which the size of the second modified portions b1 to b4 is likely to reduce. The output of the laser beam irradiating from the first surface 11 side to the interior of the substrate 10 is set to be constant in the thickness direction of the substrate 10. As a result, variation in a separation distance in the second direction d2 between each of the first modified portions a1 to a4 and each of the second modified portions b1 to b4 generated depending on the positions in the thickness direction of the substrate 10 is reduced. This may make it possible to suppress a situation in which a second modified portion far from the first surface 11 has a smaller influence on the promotion of the crack extension of the first modified portion adjacent to the second modified portion.

Fourth Embodiment

Figure 10:
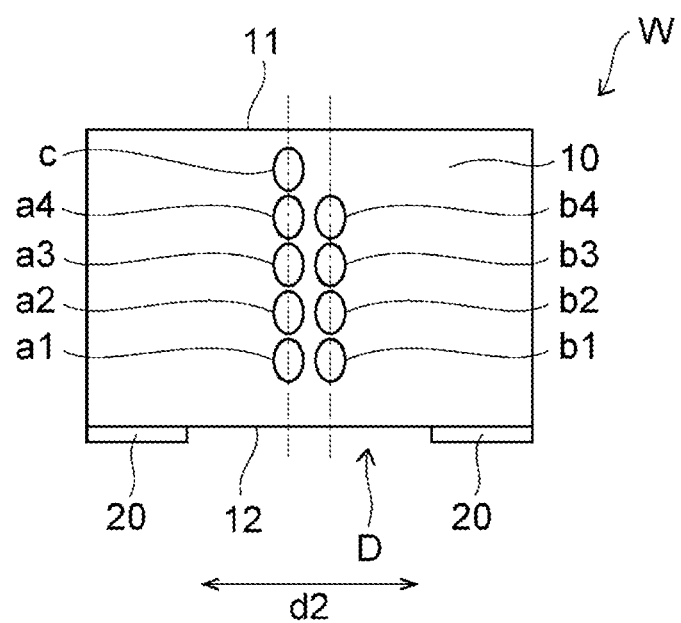
FIG. 10 is a schematic cross-sectional view illustrating a step of irradiating a laser beam in a method of manufacturing a semiconductor element according to a fourth embodiment of the present disclosure.
Figure 1:
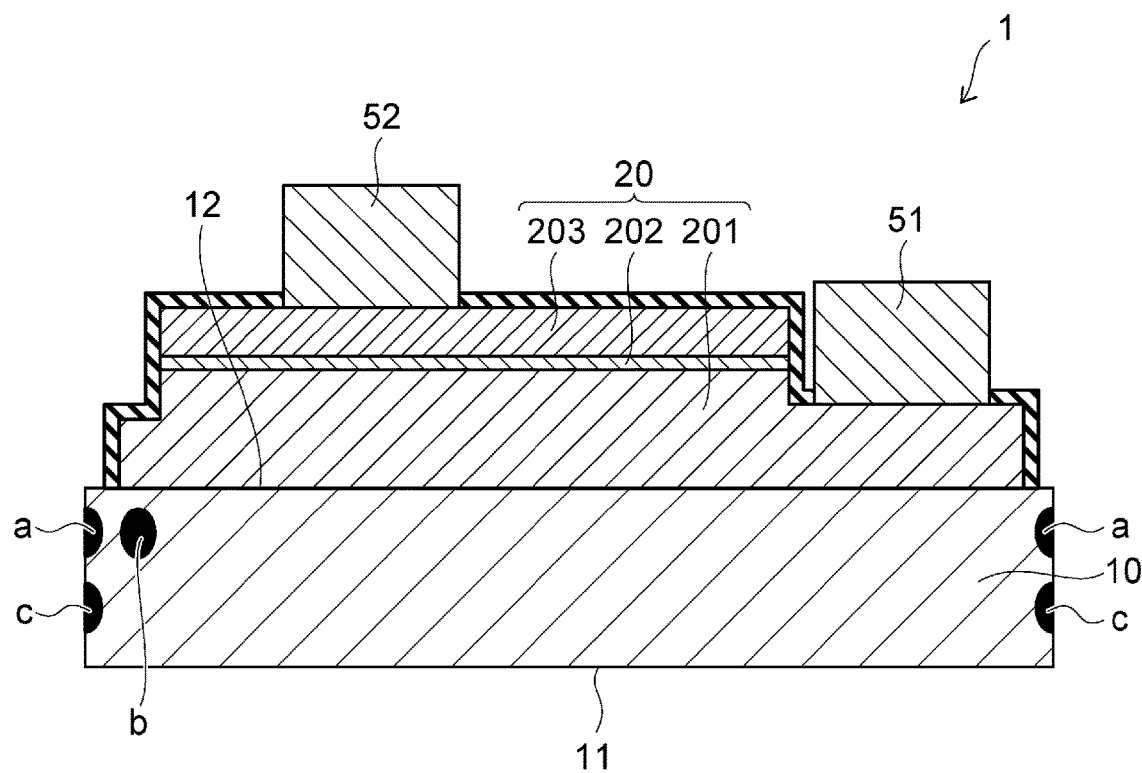

FIG. 10 is a schematic cross-sectional view illustrating a step of irradiating a laser beam in a method of manufacturing a semiconductor element according to a fourth embodiment of the present disclosure. In FIG. 10, a virtual line passing through the centers of modified portions in the second direction d2 and extending along the thickness direction of the substrate 10 is represented by a dot-dash line.

The fourth embodiment is the same as the second embodiment except that, in a plurality of pairs of the first modified portions a1 to a4 and the second modified portions b1 to b4, the first modified portions a1 to a4 and the second modified portions b1 to b4 are formed by further increasing the output of a laser beam for a pair closer to the second surface 12.

The energy of the laser beam is likely to reduce in the laser beam focusing section at a position farther from the first surface 11. Thus, the energy to extend cracks from the first modified portions a1 to a4 and the energy for the second modified portions b1 to b4 to promote the extension of the cracks of the first modified portions a1 to a4 adjacent thereto is likely to be insufficient. As such, in the fourth embodiment, the output of the laser beam is further increased for a position farther from the first surface 11 to form the first modified portions a1 to a4 and the second modified portions b1 to b4. This may make it possible to suppress the occurrence of insufficient extension of the crack at a position far from the first surface 11.

In the second to fourth embodiments illustrated in FIGS. 8 to 10, for example, the thickness of the substrate 10 is 700 μm, the first modified portion a1 and the second modified portion b1 are formed at a position with a distance of 550 μm from the first surface 11, the first modified portion a2 and the second modified portion b2 are formed at a position with a distance of 420 μm from the first surface 11, the first modified portion a3 and the second modified portion b3 are formed at a position with a distance of 300 μm from the first surface 11, the first modified portion a4 and the second modified portion b4 are formed at a position with a distance of 210 μm from the first surface 11, and the third modified portion c is formed at a position with a distance of 120 μm from the first surface 11. A position that is set inside the substrate 10 when a laser beam is to be irradiated thereto from the first surface 11 side can be shifted from the position where a modified portion is actually formed. In this case, the position to which the laser beam is irradiated can be adjusted while taking the amount of shift into consideration.

In the second embodiment and the third embodiment, the output of the laser beam used for forming the first modified portions a1 to a4, the second modified portions b1 to b4, and the third modified portion c is, for example, 6.0 μJ.

In the fourth embodiment, for example, the output of the laser beam used for forming the third modified portion c is 6.0 μJ, the output of the laser beam used for forming the first modified portion a4 and the second modified portion b4 is 7.0 μJ, the output of the laser beam used for forming the first modified portion a3 and the second modified portion b3 is 8.0 μJ, the output of the laser beam used for forming the first modified portion a2 and the second modified portion b2 is 9.0 μJ, and the output of the laser beam used for forming the first modified portion a1 and the second modified portion b1 is 10.0 μJ.

In the second embodiment and the fourth embodiment, the distance between the centers in the second direction d2 of the first modified portion a1 and the second modified portion b1, the distance between the centers in the second direction d2 of the first modified portion a2 and the second modified portion b2, the distance between the centers in the second direction d2 of the first modified portion a3 and the second modified portion b3, and the distance between the centers in the second direction d2 of the first modified portion a4 and the second modified portion b4 is 6.0 μm, for example.

In the third embodiment, for example, the distance between the centers in the second direction d2 of the first modified portion a1 and the second modified portion b1 is 4.0 μm, the distance between the centers in the second direction d2 of the first modified portion a2 and the second modified portion b2 is 4.5 μm, the distance between the centers in the second direction d2 of the first modified portion a3 and the second modified portion b3 is 5.0 μm, and the distance between the centers in the second direction d2 of the first modified portion a4 and the second modified portion b4 is 5.5 μm.

In the second to fourth embodiments illustrated in FIGS. 8 to 10, after the third irradiation step, a fourth irradiation step can also be provided in which the laser beam is irradiated from the first surface 11 side to a position overlapping the third modified portion c.

Furthermore, in the second to fourth embodiments, the first modified portions a1 to a4 and the third modified portion c are formed in such a manner that the distance from the first modified portion a1, which is closest to the second surface 12 among the first modified portions a1 to a4, to the second surface 12 is larger than the distance from the third modified portion c to the first surface 11. Therefore, thermal damage to the semiconductor layer 20 caused by laser beam irradiation can be suppressed, and a crack extending from the third modified portion c reaching the first surface 11 can be facilitated, thereby making it easier to perform cutting.

In the second to fourth embodiments, four pairs of the first modified portions a1 to a4 and the second modified portions b1 to b4 are described, but two pairs, three pairs, or five or more pairs can be overlapped in the thickness direction of the substrate 10.

In the first to fourth embodiments, it is preferable that no other modified portion be formed between the third modified portion c and the first surface 11. In addition, it is preferable that no other modified portion be formed between the third modified portion c and the first modified portion a, and between the third modified portion c and the second modified portion b.

FIG. 11 is a schematic cross-sectional view of a semiconductor element 1 manufactured in one embodiment of the present disclosure. In the semiconductor element 1 illustrated in FIG. 11, the first surface 11 of the substrate 10, the second surface 12 thereof opposing the first surface 11, the semiconductor layer 20 formed on the second surface 12, and a first electrode 51 and a second electrode 52 formed on the semiconductor layer 20 are depicted. In addition, the semiconductor layer 20 includes a first semiconductor layer 201, an active layer 202, and a third semiconductor layer 203 in that order from the second surface 12 side. The active layer 202 can be rephrased as the second semiconductor layer 202. The first semiconductor layer 201 is, for example, an n-type layer, and the third semiconductor layer 203 is, for example, a p-type layer. The first electrode 51 is formed to connect to the first semiconductor layer 201, and the second electrode 52 is formed to connect to the third semiconductor layer 203. On a lateral surface of the substrate 10, a first region in which a modified portion a is exposed, and a second region in which a modified portion c is exposed are present. In the substrate 10, the modified portion is, for example, a portion having a lower light transmissivity than a light transmissivity of a portion with no modified portion. The first region extends along a first direction (a direction passing through the plane of the drawing of FIG. 11) parallel to the first surface 11 at a position apart from the first surface 11 and the second surface 12. The second region extends along the first direction at a position apart from the first surface 11 between the first region and the first surface 11. A section of the lateral surface of the substrate 10 where neither the first region nor the second region is formed is a substantially flat region with a relatively small surface roughness, and the surface roughness of the first region and the second region is larger than that of the flat region. The surface roughness of the lateral surface of the substrate 10 can be measured with, for example, laser microscope. The surface roughnesses Rz of the first region and the second region is, for example, in a range from 3 μm to 7 μm. The surface roughness Rz of the flat region is, for example, in a range from 0.1 μm to 2.5 μm. In the interior of one substrate 10, a modified portion b is formed adjacent to the modified portion a of one lateral surface of the substrate 10. A plurality of the modified portions b are aligned along the first direction inside the substrate 10 at a position shifted from the first region in a second direction intersecting with the first direction and parallel to the first surface 11. In the interior of this substrate 10, no modified portion b is formed adjacent to the modified portion a of the other lateral surface of the substrate 10.

Embodiments of the present invention have been described above with reference to specific examples. However, the present invention is not limited to these specific examples. All aspects that can be practiced by a person skilled in the art modifying the design as appropriate based on the above-described embodiments of the present invention are also included in the scope of the present invention, as long as they encompass the spirit of the present invention. In addition, in the spirit of the present invention, a person skilled in the art can conceive of various modified examples and modifications, and those modified examples and modifications will also fall within the scope of the present invention.

What is claimed is:

1. A method of manufacturing a semiconductor element, comprising:
   providing a substrate having a first surface and a second surface;
   performing a first irradiation step comprising irradiating a laser beam from a first surface side to an interior of the substrate along a first direction parallel to the first surface, so as to form a plurality of first modified portions aligned along the first direction in the interior of the substrate, and a crack extending from at least one of the plurality of first modified portions toward at least the first surface;
   after performing the first irradiation step, performing a second irradiation step comprising irradiating a laser beam from the first surface side to a position shifted from the first modified portions in a second direction intersecting with the first direction and parallel to the first surface, so as to form a plurality of second modified portions aligned along the first direction at a position adjacent to the plurality of first modified portions in the second direction;

after performing the second irradiation step, performing a third irradiation step comprising irradiating a laser beam from the first surface side along the first direction, so as to form a plurality of third modified portions aligned along the first direction at a position that (i) is closer to the first surface than is the plurality of first modified portions and (ii) overlaps the plurality of first modified portions in a thickness direction of the substrate; and after performing the third irradiation, cutting the substrate, which comprises pressing the substrate from a second surface side with a pressing member, wherein no modified portion is formed at a position that is (i) adjacent to the third modified portions in the second direction and (ii) overlaps the second modified portions in the thickness direction of the substrate.

2. The method of manufacturing a semiconductor element according to claim 1, further comprising:

after performing the third irradiation step, performing a fourth irradiation step comprising irradiating a laser beam from the first surface side at a position identical to a position of the third modified portion.

3. The method of manufacturing a semiconductor element according to claim 1, wherein:

the step of providing the substrate comprises providing a wafer that comprises the substrate and a semiconductor layer located on the second surface.

4. The method of manufacturing a semiconductor element according to claim 2, wherein:

the step of providing the substrate comprises providing a wafer that comprises the substrate and a semiconductor layer located on the second surface.

5. The method of manufacturing a semiconductor element according to claim 3, wherein:

the first modified portion and the third modified portion are formed such that a distance from one of the plurality of first modified portions to the second surface is greater than a distance from one of the plurality of third modified portions to the first surface.

6. The method of manufacturing a semiconductor element according to claim 4, wherein:

the first modified portion and the third modified portion are formed such that a distance from one of the plurality of first modified portions to the second surface is greater than a distance from one of the plurality of third modified portions to the first surface.

7. The method of manufacturing a semiconductor element according to claim 3, wherein:

before performing the third irradiation, the step of performing the first irradiation and the step of performing the second irradiation are repeated to form, in the thickness direction of the substrate, a plurality of pairs of the first modified portion and the second modified portion adjacent to each other in the second direction.

8. The method of manufacturing a semiconductor element according to claim 7, wherein:

in the plurality of pairs, as the pairs become closer to the second surface, a distance in the second direction between a center of the first modified portion and a center of the second modified portion becomes smaller.

9. The method of manufacturing a semiconductor element according to claim 7, wherein:

in forming the plurality of pairs, as the pairs become closer to the second surface, an output of the laser beam to form the first modified portion and the second modified portion is higher.

10. The method of manufacturing a semiconductor element according to claim 9, wherein:

the plurality of pairs of the first modified portion and the second modified portion include a first pair, and a second pair that is closer to the second surface than the first pair, the laser beam is irradiated to form the plurality of pairs of the first modified portion and the second modified portion with a pulse width in a range from 100 fsec to 1000 psec, an output of a laser beam irradiated to form the first pair is 7 µJ of pulse energy, and an output of a laser beam irradiated to form the second pair is 8 µJ of pulse energy.

* * * * *